US012696745B2

(12) United States Patent
Motoyama et al.

(10) Patent No.: US 12,696,745 B2
(45) Date of Patent: Jul. 28, 2026

(54) COMPOSITE CONTACT BETWEEN BACKSIDE POWER ELEMENT AND SOURCE/DRAIN REGION

(71) Applicant: International Business Machines Corporation, Armonk, NY (US)

(72) Inventors: Koichi Motoyama, Clifton Park, NY (US); Alexander Reznicek, Troy, NY (US); Tsung-Sheng Kang, Ballston Lake, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 17/955,677

(22) Filed: Sep. 29, 2022

(65) Prior Publication Data

US 2024/0112986 A1     Apr. 4, 2024

(51) Int. Cl.
| | |
|---|---|
| *H10W 20/20* | (2026.01) |
| *H10D 30/43* | (2025.01) |
| *H10D 30/67* | (2025.01) |
| *H10D 62/10* | (2025.01) |
| *H10D 84/83* | (2025.01) |
| *H10W 20/00* | (2026.01) |
| *H10W 20/41* | (2026.01) |

(52) U.S. Cl.
CPC ............ *H10W 20/20* (2026.01); *H10D 30/43* (2025.01); *H10D 30/6729* (2025.01); *H10D 30/6757* (2025.01); *H10D 62/121* (2025.01); *H10D 84/834* (2025.01); *H10W 20/023* (2026.01); *H10W 20/069* (2026.01); *H10W 20/427* (2026.01)

(58) Field of Classification Search
CPC ........... H01L 21/76897; H01L 23/5226; H01L 23/481; H01L 21/76805; H01L 21/76877; H10D 30/024; H10D 30/6757; H10D 30/6735
See application file for complete search history.

(56) References Cited

U.S. PATENT DOCUMENTS

| | | |
|---|---|---|
| 10,475,692 B2 | 11/2019 | Licausi et al. |
| 2021/0111115 A1 | 4/2021 | Morrow et al. |
| 2021/0134721 A1 | 5/2021 | Chiang et al. |
| 2021/0202385 A1 | 7/2021 | Huang et al. |
| 2021/0305252 A1 | 9/2021 | Chiang et al. |
| 2021/0305381 A1 | 9/2021 | Chiang et al. |
| 2021/0305428 A1 | 9/2021 | Ju et al. |

(Continued)

OTHER PUBLICATIONS

C.-H. Ji et al., "Electroplated Metal Buried Interconnect and Through-Wafer Metal-Filled Via Technology for High-Power Integrated Electronics," IEEE Transactions on Advanced Packaging, Aug. 2009, pp. 695-702, vol. 32, No. 3.

*Primary Examiner* — Britt Hanley
*Assistant Examiner* — Jason James Greaving
(74) *Attorney, Agent, or Firm* — L. Jeffrey Kelly; Ryan, Mason & Lewis, LLP

(57) ABSTRACT

A semiconductor device includes a transistor having a source/drain region and a contact disposed on the source/drain region. The semiconductor device further includes a via extending from the contact along a side of the source/drain region to a power element. The contact and the via each comprise a plurality of conductive materials.

17 Claims, 18 Drawing Sheets

(56)     References Cited

U.S. PATENT DOCUMENTS

| | | | |
|---|---|---|---|
| 2021/0351303 A1 | 11/2021 | Ju et al. | |
| 2021/0376071 A1 | 12/2021 | Liu et al. | |
| 2021/0376093 A1 | 12/2021 | Chu et al. | |
| 2022/0037193 A1 | 2/2022 | Yu et al. | |
| 2022/0069117 A1 | 3/2022 | Yu et al. | |
| 2024/0055493 A1* | 2/2024 | Na | H01L 23/5286 |

* cited by examiner

INTEGRATED CIRCUIT
1800

SEMICONDUCTOR DEVICE(S) WITH A BACKSIDE POWER ELEMENT CONNECTION FOR A SOURCE/DRAIN REGION
1810

COMPOSITE CONTACT BETWEEN BACKSIDE POWER ELEMENT AND SOURCE/DRAIN REGION

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming a connection to a backside power element for a source/drain region of a semiconductor device.

In one embodiment, a semiconductor device includes a transistor having a source/drain region and a contact disposed on the source/drain region. The semiconductor device further includes a via extending from the contact along a side of the source/drain region to a power element. The contact and the via each comprise a plurality of conductive materials.

In another embodiment, an integrated circuit includes a transistor having a source/drain region, a contact disposed on the source/drain region, a power element, and an isolation region disposed on the power element. A via extends from the contact through the isolation region to the power element, and the contact and the via each comprise a plurality of conductive materials.

In another embodiment, a semiconductor device includes a source/drain region disposed on a first side of a semiconductor layer, a contact disposed on the source/drain region on the first side of the semiconductor layer, and a power element disposed on a second side of the semiconductor layer. The semiconductor device further includes a via extending from the contact along a side of the source/drain region to the power element. The contact and the via each comprise a plurality of conductive materials.

These and other features and advantages of embodiments described herein will become more apparent from the accompanying drawings and the following detailed description.

DETAILED DESCRIPTION

Figure 1:
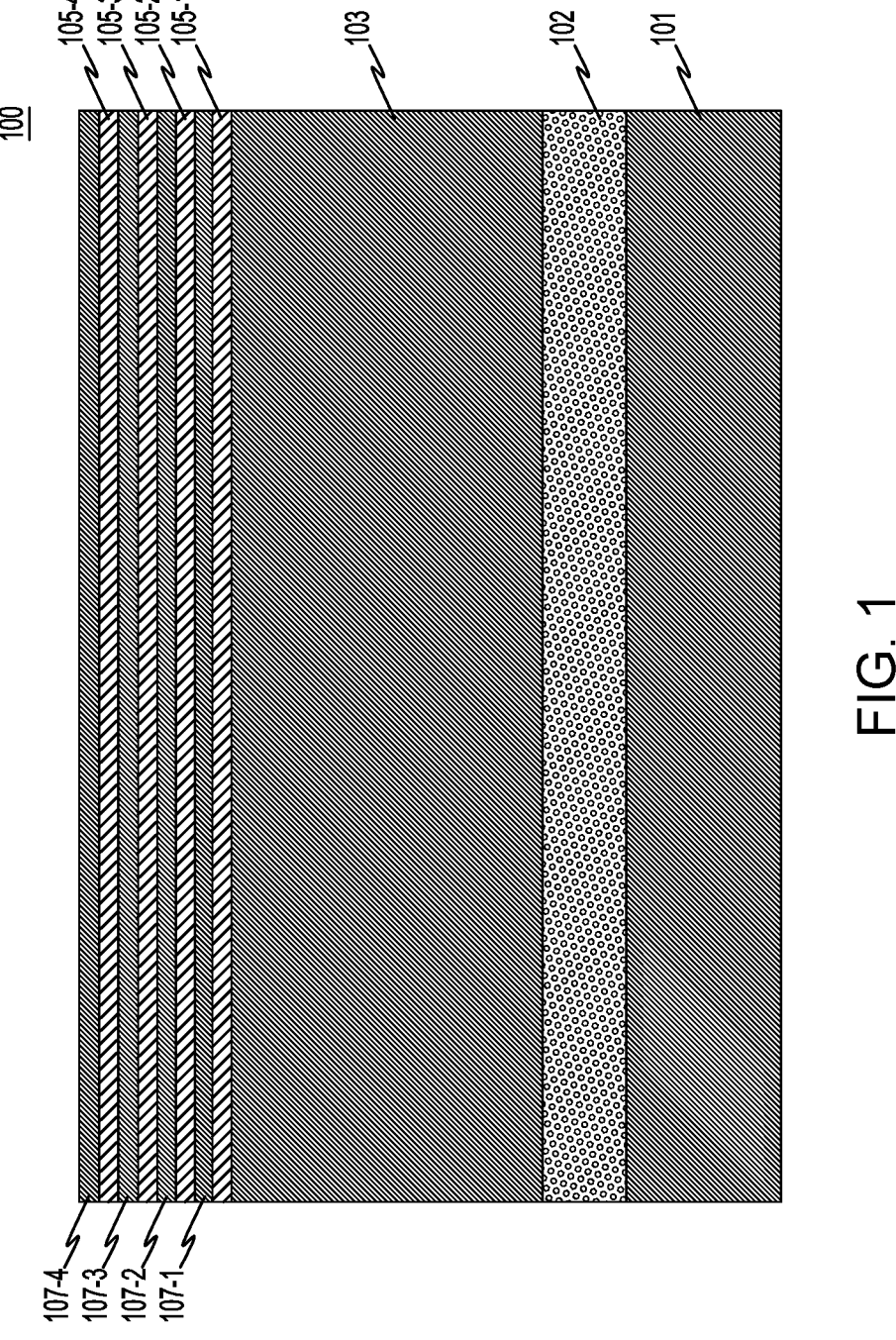
FIG. 1 is a schematic cross-sectional view of a semiconductor structure including a stacked structure of silicon germanium (SiGe) and silicon (Si) nanosheet layers, according to an embodiment of the invention.

Illustrative embodiments of the invention may be described herein in the context of illustrative methods for forming a backside power element connection to a source/drain region where a source/drain contact and backside via between a source/drain region and a backside power element include composite contact materials, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers may be used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (NFET and PFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves selectively removing sacrificial layers, which may be formed of silicon germanium (SiGe), between sheets of channel material, which may be formed of silicon (Si).

As discussed above, various techniques may be used to reduce the size of FETs, including through the use of fin-shaped channels in FinFET devices, and through the use of stacked nanosheet channels formed over a semiconductor substrate.

As used herein, "frontside or "first side" refers to a side on top of semiconductor substrate 101 or semiconductor layer 103 in the orientation shown in the cross-sectional views of FIGS. 1-5, 7-10, 12 and 13. As used herein, "backside" or "second side" refers to a side below the semiconductor substrate 101 and or semiconductor layer 103 in the orientation shown in the cross-sectional views of FIGS. 1-5, 7-10, 12 and 13 (e.g., opposite the "frontside").

Referring to FIG. 1, a semiconductor structure 100 includes a stacked structure of silicon germanium (SiGe) and silicon (Si) nanosheet layers, according to an embodiment of the invention. A semiconductor substrate 101 comprises semiconductor material including, but not limited to, Si, II-V compound semiconductor materials or other like semiconductor materials. In addition, multiple layers of the semiconductor materials can be used as the semiconductor material of the semiconductor substrate 101. An etch stop layer 102 is formed on the semiconductor substrate 101, and may comprise, for example, silicon oxide ($SiO_x$) (where x is for example, 2, 1.99 or 2.01), SiGe. A semiconductor layer 103 comprising, for example, the same semiconductor material as the semiconductor substrate 101, or other like semiconductor material, is formed on the etch stop layer 102.

Layers of silicon germanium 105-1, 105-2, 105-3 and 105-4 (collectively "SiGe layers 105"), and of silicon 107-1, 107-2, 107-3 and 107-4 (collectively "Si layers 107") are stacked in an alternating configuration on the semiconductor layer 103, so that a first SiGe layer 105-1 is followed by a first Si layer 107-1 on the first SiGe layer 105-1, which is followed by a second SiGe layer 105-2 on the first Si layer 107-1, and so on. As can be understood, SiGe layers 105 and Si layers 107 are epitaxially grown.

While four SiGe layers 105 and four Si layers 107 are shown, the embodiments of the present invention are not necessarily limited to the shown number of SiGe layers 105 and Si layers 107, and there may be more or less layers in the same alternating configuration depending on design constraints. According to an embodiment, the SiGe layers 105 include SiGe having, for example, a Si concentration of 75% and a Ge concentration of 25%. However, other ratios of Si to Ge may be used.

Although silicon germanium is described as the sacrificial material for SiGe layers 105, and silicon is described as the nanosheet channel material for Si layers 107, other materials can be used. For example, Ge can be used as sacrificial material for SiGe layers 105 and gallium arsenide (GaAs) can be used as the nanosheet channel material for Si layers 107.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epi-
taxially grown material is formed.

The epitaxial deposition process may employ the depo-
sition chamber of a chemical vapor deposition type appara-
tus, such as a rapid thermal chemical vapor deposition
(RTCVD), ultra-high vacuum chemical vapor deposition
(UHVCVD), or a low-pressure chemical vapor deposition
(LPCVD) apparatus. A number of different sources may be
used for the epitaxial deposition of the in situ doped semi-
conductor material. In some embodiments, the gas source
for the deposition of an epitaxially formed semiconductor
material may include silicon (Si) deposited from silane,
disilane, trisilane, tetrasilane, hexachlorodisilane, tetrachlo-
rosilane, dichlorosilane, trichlorosilane, and combinations
thereof. In other examples, when the semiconductor material
includes germanium, a germanium gas source may be
selected from the group consisting of germane, digermane,
halogermane, dichlorogermane, trichlorogermane, tetra-
chlorogermane and combinations thereof. The temperature
for epitaxial deposition typically ranges from 450° C. to
900° C. Although higher temperature typically results in
faster deposition, the faster deposition may result in crystal
defects and film cracking.

In a non-limiting illustrative embodiment, a height of the
SiGe layers 105 can be in the range of about 6 nm to about
15 nm depending on the application of the device. In a
non-limiting illustrative embodiment, Si layers 107 of the
SiGe/Si nanosheet stack can be formed on SiGe layers 105
by epitaxial growth, and SiGe layers 105 of the SiGe/Si
nanosheet stack can be formed on Si layers 107 by epitaxial
growth. In accordance with an embodiment of the present
invention, the Si layers 107 can include the same or a similar
composition to the semiconductor substrate 101 and semi-
conductor layer 103. In a non-limiting example, a height of
the Si layers 107 can be in the range of about 6 nm to about
15 nm depending on the desired process and application. In
accordance with an embodiment of the present invention,
each of the Si layers 107 has the same or substantially the
same composition and size as each other, and each of the
SiGe layers 105 has the same or substantially the same
composition and size as each other.

Figure 2:
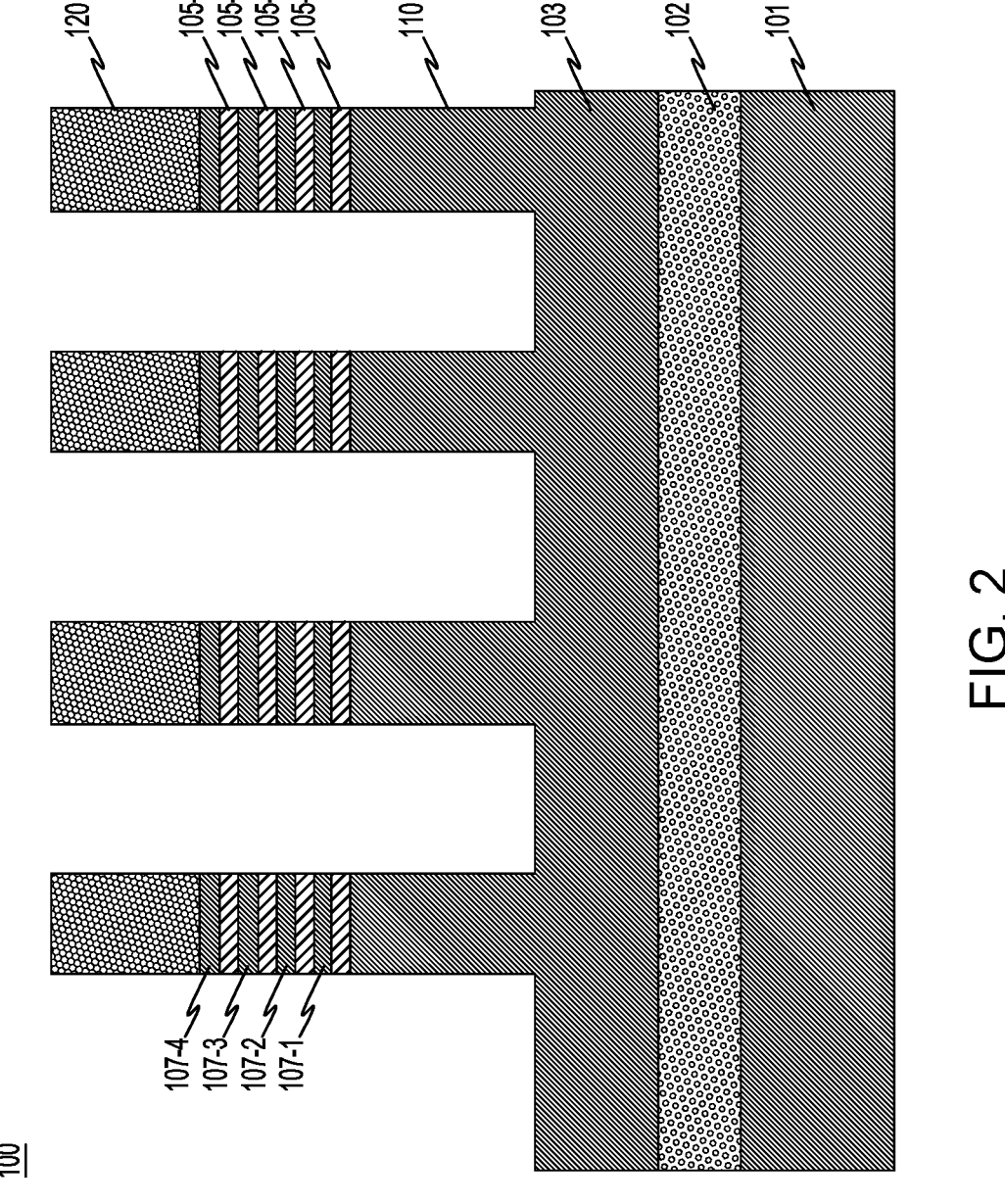
FIG. 2 is a schematic cross-sectional view illustrating patterning of the stacked nanosheet layers from the FIG. 1 structure, according to an embodiment of the invention.

FIG. 2 is a schematic cross-sectional view illustrating
patterning of the stacked nanosheet layers, according to an
embodiment of the invention. Referring to FIG. 2, hard-
masks 120 are formed on portions of the Si layer 107-4. The
hardmask material can comprise for example, one or more
dielectrics, including, but not necessarily limited to, silicon
nitride (SiN), silicon carbide (SiC), silicon oxynitride
(SiON), carbon-doped silicon oxide (SiOC), silicon-carbon-
nitride (SiCN), boron nitride (BN), silicon boron nitride
(SiBN), silicoboron carbonitride (SiBCN), silicon oxycabo-
nitride (SiOCN), silicon oxide, and combinations thereof.
Exposed portions of semiconductor structure 100, which are
not under the hardmasks 120, are removed using, for
example, an etching process, such as reactive ion etching
(RIE). As can be seen in FIG. 2, the portions of the stacked
nanosheets or nanowires under the hardmasks 120 remain
after the etching process, and portions of the stacked
nanosheets or nanowires in areas not under the hardmasks
120 are removed. For ease of explanation, four nanosheet
stacks are shown. However, the embodiments are not limited
thereto, and more or less than four nanosheet stacks can be
formed. Referring to FIG. 2, portions of the semiconductor
layer 103 are etched during the patterning to form pedestal
portions 110 from part of the semiconductor layer 103.

Figure 3:
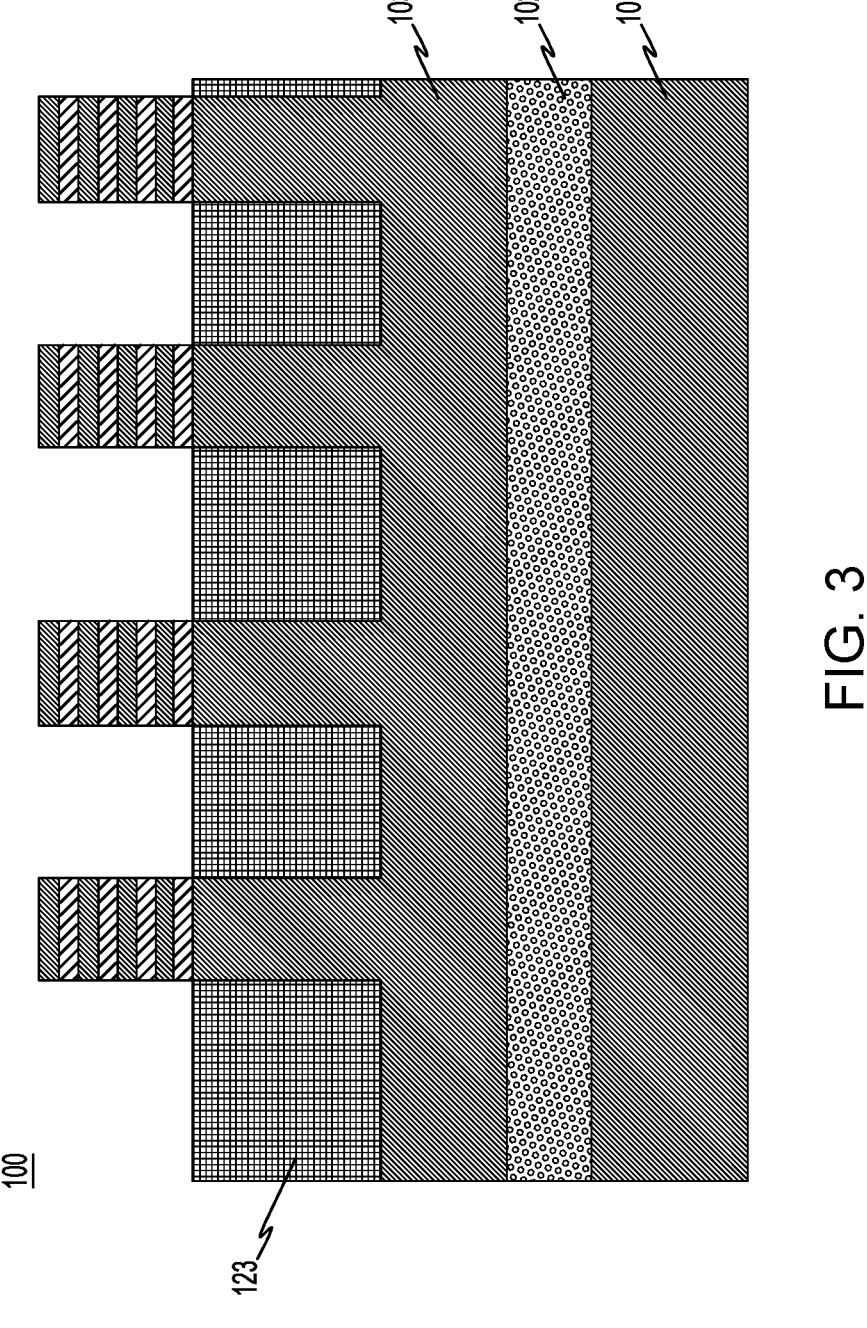
FIG. 3 is a schematic cross-sectional view illustrating hardmask removal from and isolation region formation on the FIG. 2 structure, according to an embodiment of the invention.

Referring to FIG. 3, the hardmasks 120 are removed and
a dielectric layer 123 fills in the recessed portions of the semiconductor layer 103 between the pedestal portions 110
to form a plurality of isolation regions (e.g., shallow trench
isolation (STI) regions). The dielectric layer 123 may com-
prise, for example, SiN, SiON, SiCN, BN, SiBN, SiBCN,
SiOCN and combinations thereof, and is deposited using
deposition techniques such as, for example, chemical vapor
deposition (CVD), plasma enhanced CVD (PECVD), radio-
frequency CVD (RFCVD), physical vapor deposition
(PVD), atomic layer deposition (ALD), molecular beam
deposition (MBD), pulsed laser deposition (PLD), and/or
liquid source misted chemical deposition (LSMCD).

Figure 4:
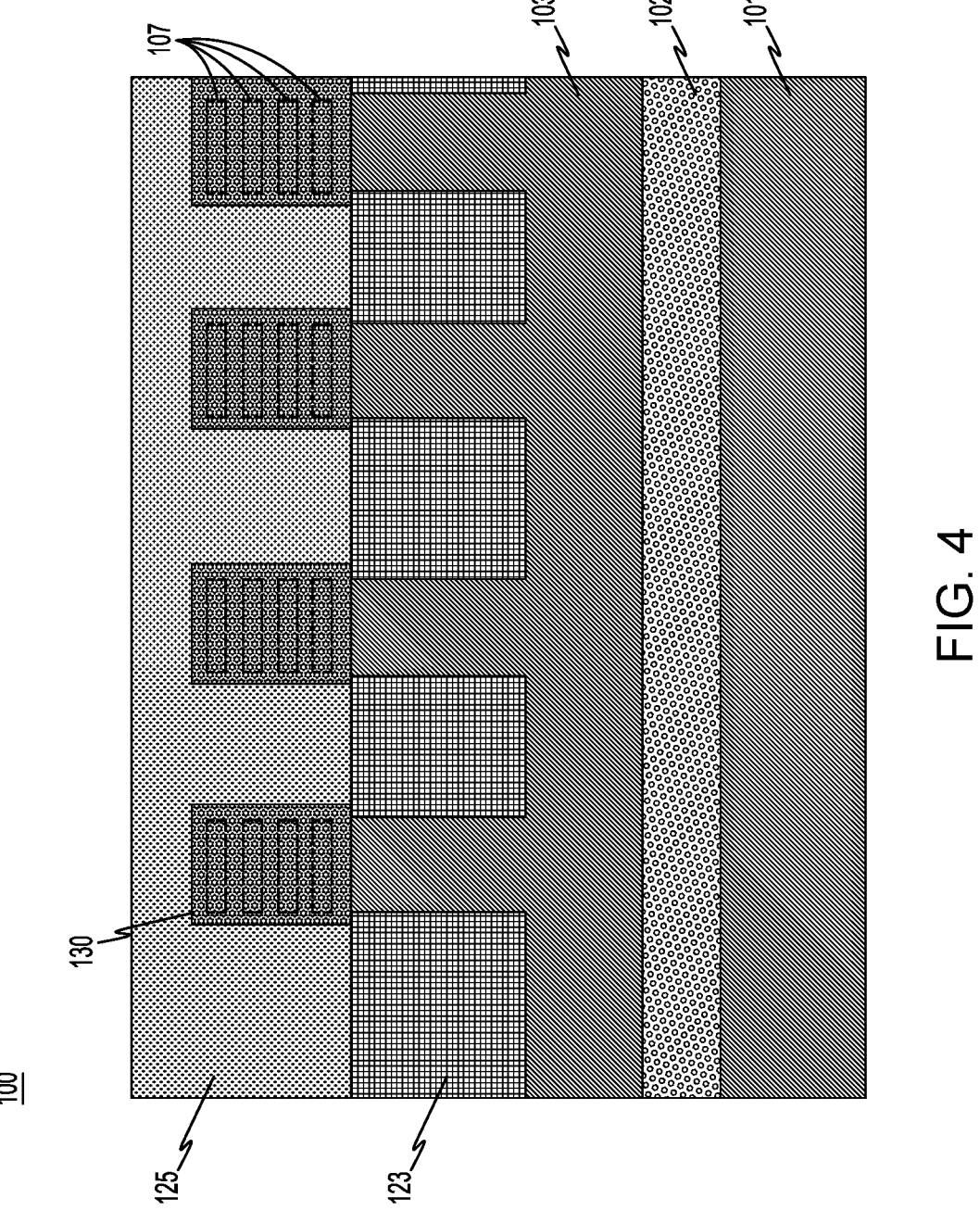
FIG. 4 is a schematic cross-sectional view illustrating inter-layer dielectric (ILD) layer and source/drain region formation on the FIG. 3 structure, according to an embodiment of the invention.

Referring to FIG. 4, epitaxial source/drain regions 130 are
grown from exposed sides of the Si layers 107 of the
nanosheet stacks. According to a non-limiting embodiment
of the present invention, the conditions of the epitaxial
growth process for the epitaxial source/drain regions 130
are, for example, RTCVD epitaxial growth using $SiH_4$,
$SiH_2Cl_2$, $GeH_4$, $CH_3SiH_3$, $B_2H_6$, $PF_3$, and/or $H_2$ gases with
temperature and pressure range of about 450° C. to about
800° C., and about 5 Torr-about 300 Torr. Although not
shown, side portions of the SiGe layers 105 can be covered
with inner spacers during the epitaxial growth of the epi-
taxial source/drain regions 130, and lateral epitaxial growth
does not occur from the SiGe layers 105 of the patterned
stacks.

After further processing, the epitaxial source/drain
regions 130 become the source/drain regions for transistor
devices such as, for example, NFETs or PFETs. The epi-
taxial source/drain regions 130 may be suitably doped, such
as by using ion implantation, gas phase doping, plasma
doping, plasma immersion ion implantation, cluster doping,
infusion doping, liquid phase doping, solid phase doping,
etc. N-type dopants may be selected from a group of
phosphorus (P), arsenic (As) and antimony (Sb), and p-type
dopants may be selected from a group of boron (B), boron
fluoride (BF2), gallium (Ga), indium (In), and thallium (Tl).

In non-limiting illustrative embodiments, the epitaxial
source/drain regions 130 can comprise in-situ phosphorous
doped (ISPD) silicon or Si:C for n-type devices, or in-situ
boron doped (ISBD) silicon germanium for p-type devices,
at concentrations of about $1×10^{19}/cm^3$ to about $3×10^{21}/cm^3$.
By "in-situ," it is meant that the dopant that dictates the
conductivity type of the doped layer is introduced during the
process step, e.g., epitaxial deposition, which forms the
doped layer. The epitaxial source/drain regions 130 may
have a width (in horizontal direction in FIG. 4) in the range
of about 10 nm to about 30 nm.

An ILD layer 125 is formed between the epitaxial source/
drain regions 130, and over the top of the epitaxial source/
drain regions 130. The ILD layer 125 is formed on the
dielectric layer 123 forming the isolation regions. The ILD
layer 125 may be formed of any suitable isolating material,
such as $SiO_x$, SiOC, SiOCN or some other dielectric mate-
rial.

Although not shown, the SiGe layers 105 are selectively
removed to create vacant areas. Then, the Si layers 107 are
suspended, and replacement gate structures, including, for
example, gate and dielectric portions are formed in place of
the SiGe layers 105. The selective removal can be performed
using wet or dry chemistries selective to Si. In non-limiting
examples, $CH_3COOH:H_2O_2:HF$ or $CF_4/O_2$ based chemis-
tries can be used. Various other etch chemistries may be
used.

In accordance with an embodiment of the present inven-
tion, each replacement gate structure includes a gate dielec-
tric layer such as, for example, a high-K dielectric layer
including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum oxide). Examples of high-k dielectric materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the replacement gate structures each include a gate region including a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The gate regions can also each further include a gate metal layer including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer.

Figure 5:
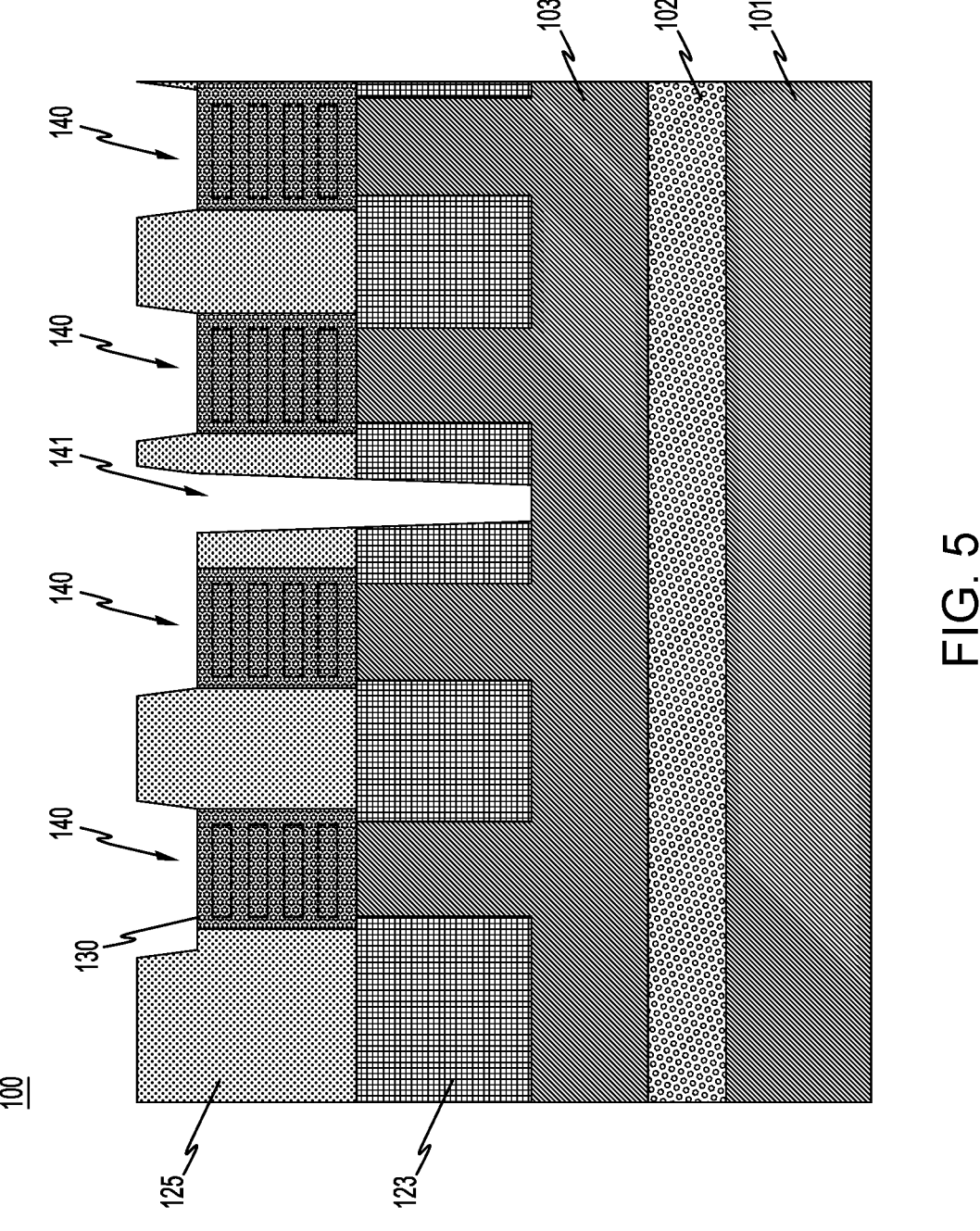
FIG. 5 is a schematic cross-sectional view illustrating source/drain region contact trench and backside power element via opening formation on the FIG. 4 structure, according to an embodiment of the invention.

Referring to FIG. 5, contact trenches 140 are formed in the ILD layer 125 to expose the epitaxial source/drain regions 130 and a via opening 141 is formed between two epitaxial source/drain regions 130 and two pedestal portions 110 through portions of the ILD layer 125 and the dielectric layer 123, and down to expose a portion of the semiconductor layer 103. As can be seen in FIG. 5, the via opening 141 is continuous with one of the contact trenches 140 (e.g., contact trench 140 to the left of the via opening 141 in FIG. 5). According to an embodiment, masks (not shown) are formed on parts of the ILD layer 125, and exposed portions of the ILD layer 125 and underlying portions of the dielectric layer 123 corresponding to where the contact trenches 140 and via opening 141 are to be formed are removed using, for example, a dry etching process using a RIE or ion beam etch (IBE) process, a wet chemical etch process or a combination of these etching processes. A dry etch may be performed using a plasma. Plasma systems can operate in several modes by adjusting the parameters of the plasma. Ion milling, sputter etching or RIE bombards the wafer with energetic ions of noble gases that approach the wafer approximately from one direction, and therefore, these processes are an anisotropic or a directional etching process. Such wet or dry etch processes include, for example, IBE by Ar/CHF₃ based chemistry.

Figure 6:
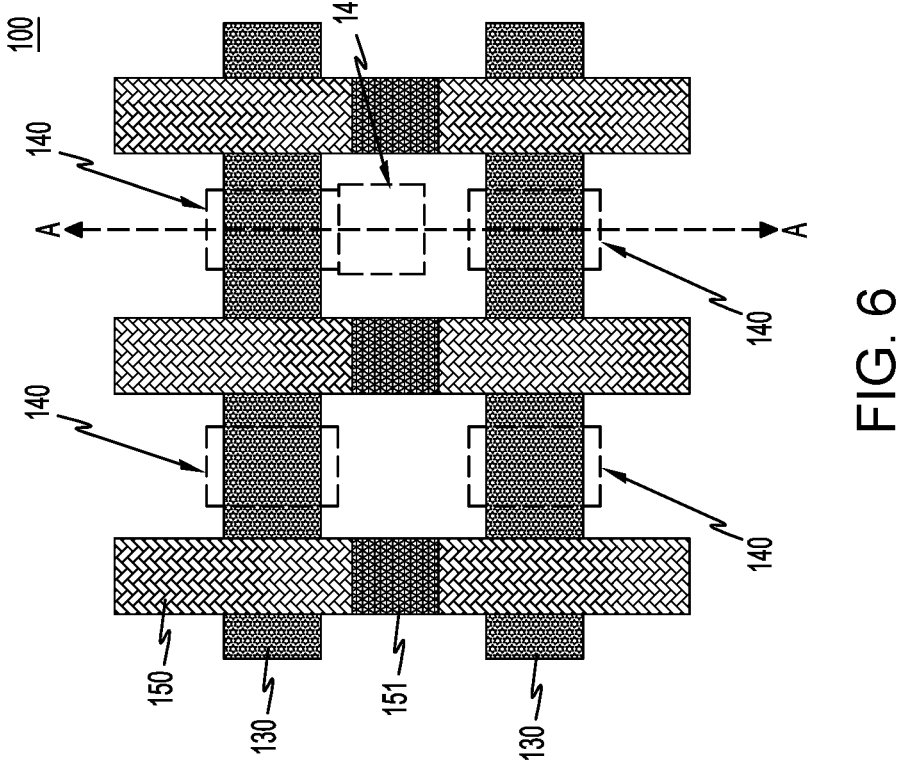
FIG. 6 is a schematic top view of a semiconductor structure including a portion of what is shown in FIG. 5, according to an embodiment of the invention.

FIG. 6 is a schematic top view of the semiconductor structure 100 including a portion of what is shown in FIG. 5. As can be understood, FIG. 5 includes the cross-section through line A-A of FIG. 6 with two contact trenches 140 on either side of the via opening 141, where one of the contact trenches 140 is continuous with the via opening 141. FIG. 6 illustrates a plurality of contact trenches 140 exposing portions of epitaxial source/drain regions 130. In addition, FIG. 6 illustrates transistor gate structures 150 and gate cut regions 151, where spaces between transistor gate structures 150 have been formed and filled with dielectric material to isolate gate regions from each other.

Figure 7:
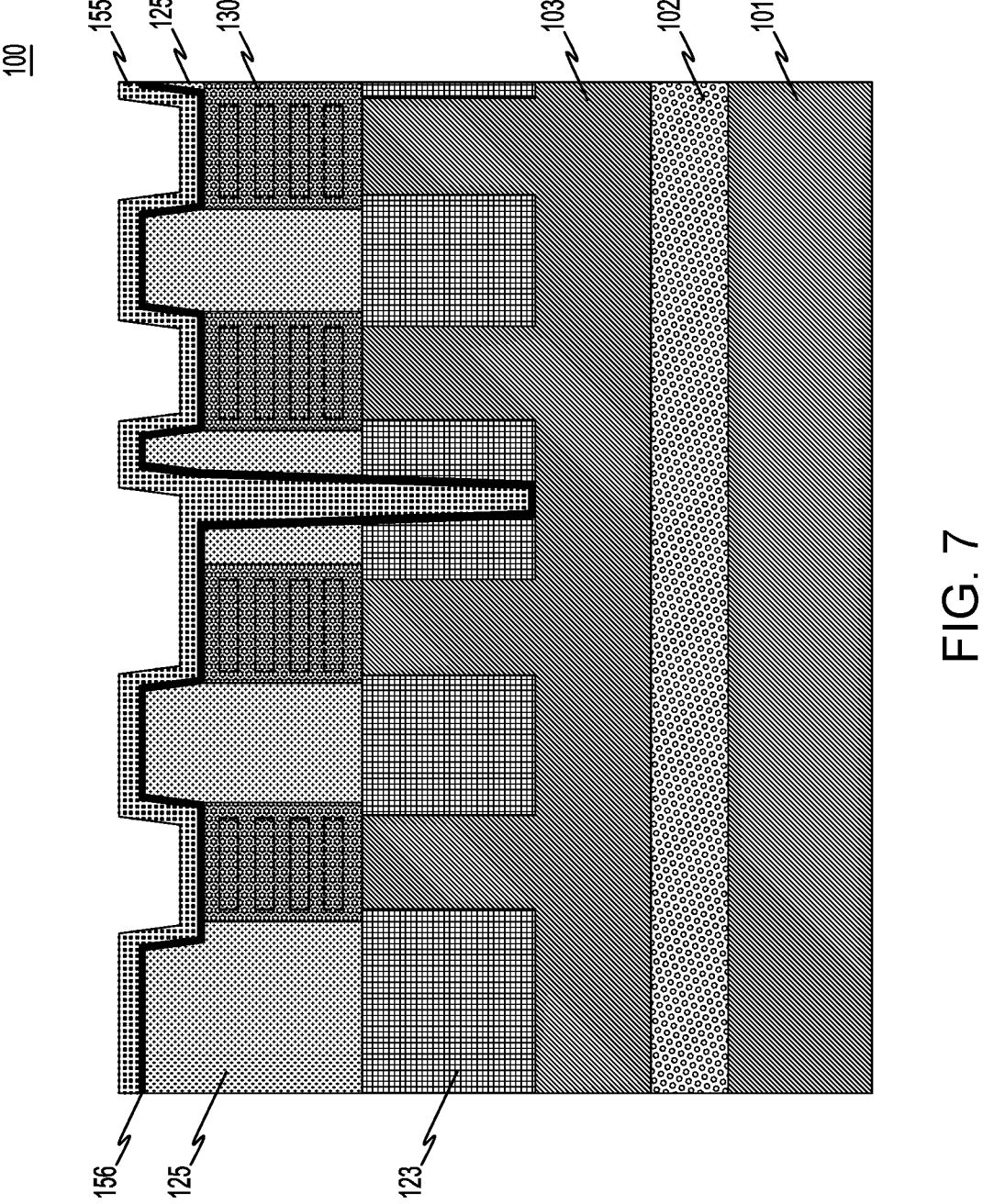
FIG. 7 is a schematic cross-sectional view illustrating liner and metal fill layer deposition in the source/drain contact trenches and backside power element via opening of the FIG. 5 structure, according to an embodiment of the invention.

Referring to FIG. 7, a liner layer 156 and a first metal fill layer 155 are conformally deposited in the contact trenches 140 and via opening 141. The first metal fill layer 155 comprises, for example, a noble metal such as, but not necessarily limited to, ruthenium, rhodium, iridium, platinum or combinations thereof. The liner layer 156 includes, for example, tantalum, tantalum nitride, titanium nitride or combinations thereof. The liner layer 156 is conformally deposited on top surfaces of the ILD layer 125, and on sidewalls and bottom surfaces of the contact trenches 140 and via opening 141, including on top surfaces of epitaxial source/drain regions 130 and top surfaces of the semiconductor layer 103. The first metal fill layer 155 is conformally deposited on the liner layer 156. As can be seen, the via opening 141 has a high aspect ratio (e.g., ratio of depth to width), such that the conformal deposition causes the first metal fill layer 155 to completely fill in the remaining space of the via opening 141 between the portions of the liner layer 156 formed on sidewalls and the bottom surface of the via opening 141. In other words, there are no voids (e.g., empty spaces) in the via opening 141. The conformal deposition techniques may comprise, for example, CVD or ALD. The depth of the via opening 141 (vertical dimension in FIG. 7) is about 50 nm to about 300 nm and the width of the via opening 141 (horizontal dimension in FIG. 7) is about 10 nm to about 50 nm. The thickness of the liner layer 156 is about 1 nm to about 5 nm.

Figure 8:
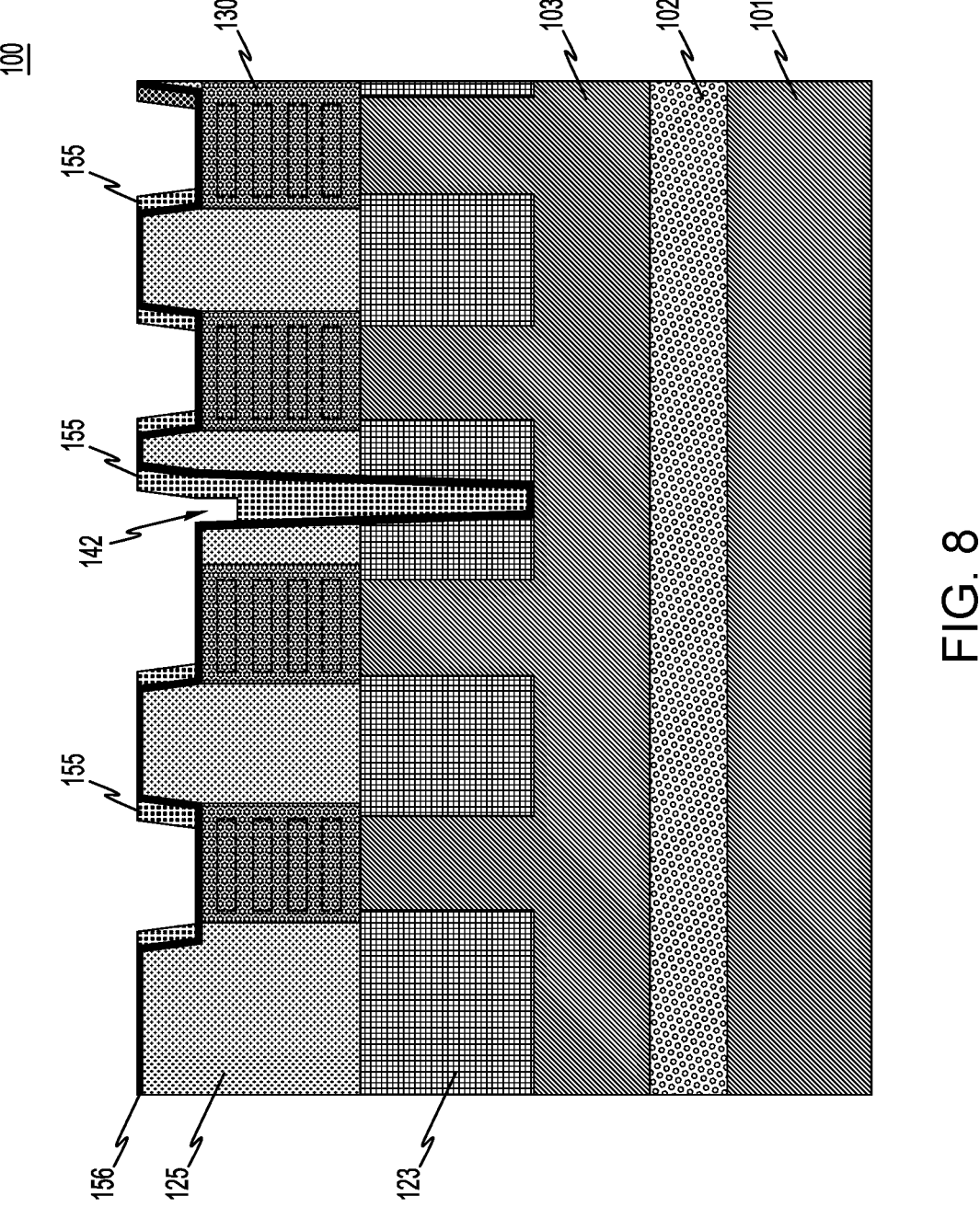
FIG. 8 is a schematic cross-sectional view illustrating removal of portions of the metal fill layer from the FIG. 7 structure, according to an embodiment of the invention.

Referring to FIG. 8, portions of the first metal fill layer 155 are removed using a dry etching process such as, for example, a process using $O_2/Cl_2$, which may have almost infinite etch selectivity against $SiO_2$. As can be seen, horizontal portions of the first metal fill layer 155 are removed from on top of the portions of the liner layer 156 located on upper surfaces the ILD layer 125, and on portions of the epitaxial source/drain regions 130 in the contact trenches 140. Parts of the first metal fill layer 155 remain on sidewalls of the contact trenches 140 and in the via opening 141. As shown in FIG. 8, in some embodiments, following the etching process, part of the first metal fill layer 155 is also removed from an upper portion of the via opening 141 to create a gouged portion 142. In illustrative embodiments, the etching process is performed so that little residue of the first metal fill layer 155 remains on the portions of the liner layer 156 located on upper surfaces the ILD layer 125.

Figure 9:
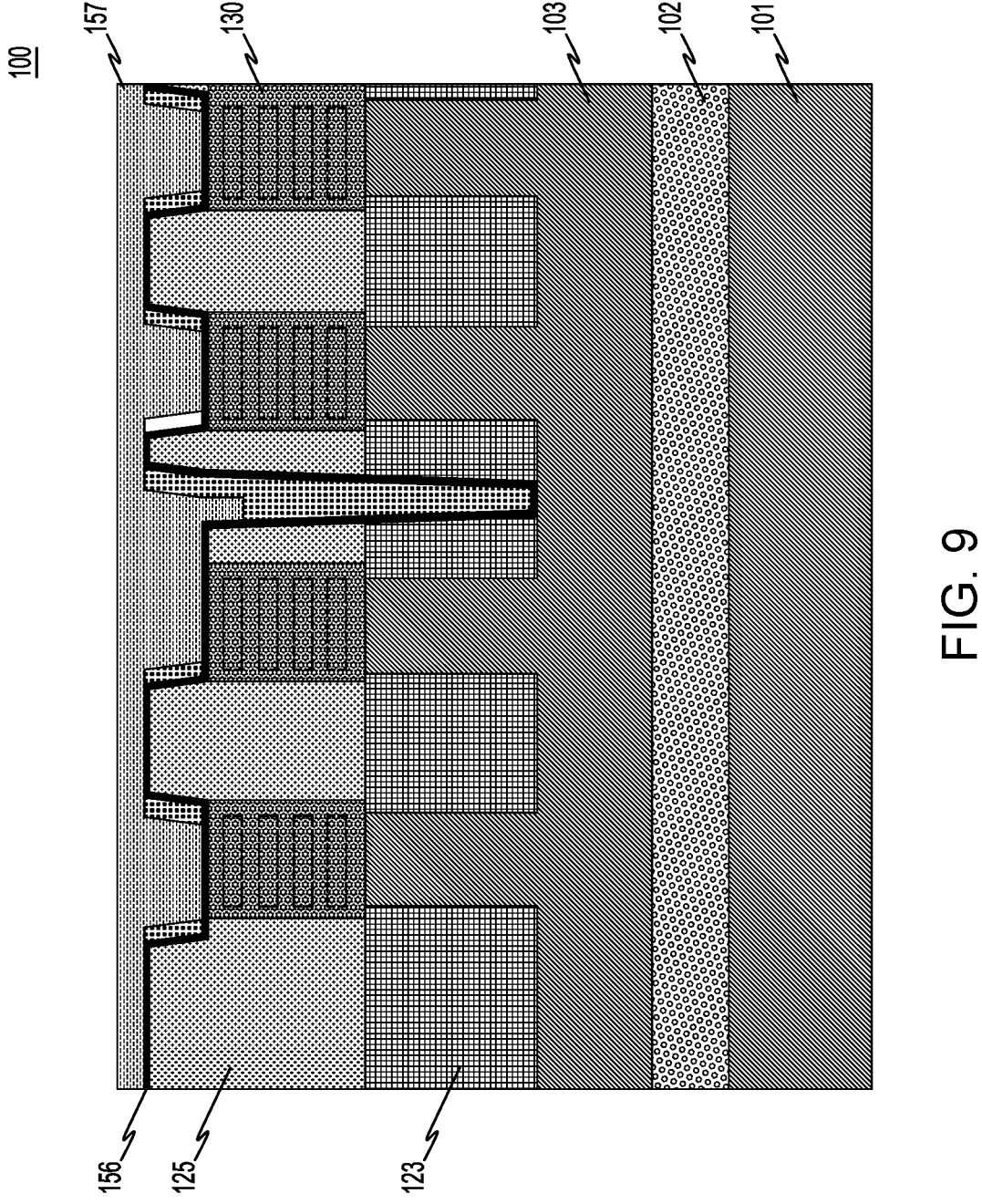
FIG. 9 is a schematic cross-sectional view illustrating deposition of an additional metal fill layer in the source/drain contact trenches and backside power element via opening of the FIG. 8 structure, according to an embodiment of the invention.

Referring to FIG. 9, a second metal fill layer 157 is deposited to fill in remaining portions of the contact trenches 140 and via opening 141. The second metal fill layer 157 comprises, for example, a conductor such as, but not necessarily limited to, cobalt, copper and tungsten, and can be deposited using, for example, a deposition technique such as CVD, PECVD, RFCVD, PVD, ALD, MBD, PLD, LSMCD, sputtering and/or plating. As can be seen, the second metal fill layer 157 is disposed on exposed portions of the liner layer 156 where the first metal fill layer 155 was removed (e.g., on the portions of the liner layer 156 located on upper surfaces the ILD layer 125, and the portions of the liner layer 156 located on portions of the epitaxial source/drain regions 130 in the contact trenches 140). In addition, the second metal fill layer 157 fills in the gouged portion 142 that, in some cases, is left following etching of the first metal fill layer 155. In illustrative embodiments, a reflow process is performed in conjunction with CVD to deposit the second metal fill layer 157. For example, a reflow deposition technique includes depositing the second metal fill layer 157 at an elevated temperature in a range of about 100° C. to about 400° C., so that the material of the second metal fill layer 157 flows through any small openings at the top of the contact trenches 140 or via opening 141 (e.g., caused by the first metal fill layer 155). Capillary action during a reflow process permits the second metal fill layer 157 to flow through openings into the contact trenches 140 or via opening 141, and completely fill in vacant portions of the contact trenches 140 or via opening 141. The contact trenches 140 and via opening 141 each comprise a plurality of conductive materials (e.g., the conductive material of the liner layer 156, the conductive material of the first metal fill layer 155 and the conductive material of the second metal fill layer 157). The conductive material of the liner layer 156 comprises, for example, tantalum, tantalum nitride or titanium nitride, the conductive material of the first metal fill layer 155 comprises, for example, a noble metal, and the conductive material of the second metal fill layer 157 comprises, for example, cobalt, copper or tungsten.

Figure 10:
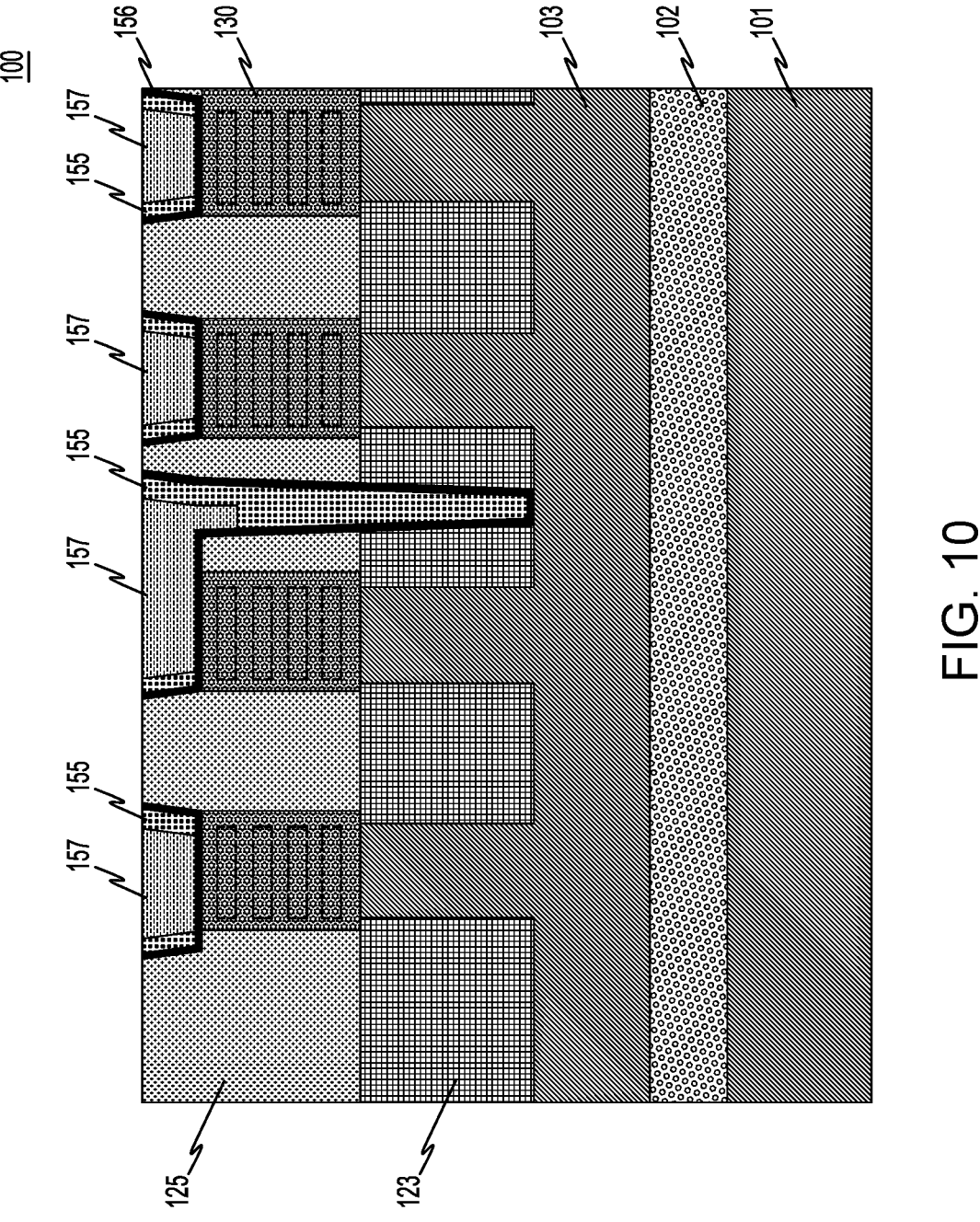
FIG. 10 is a schematic cross-sectional view illustrating planarization to remove portions of the liner and additional metal fill layer from the ILD layer of the FIG. 9 structure, according to an embodiment of the invention.

Referring to FIG. 10, following deposition of the second metal fill layer 157, a planarization process such as, for example, chemical mechanical planarization (CMP), is performed to remove the liner layer 156 and second metal fill layer 157 from the top surface of the ILD layer 125. As can be seen the top surfaces of the ILD layer 125, the resulting source/drain contacts in the contact trenches 140 and the via in the via opening 141 are planarized.

As can be understood, the resulting source/drain contacts in the contact trenches 140 and the via in the via opening 141 each comprise a composite of the material of the liner layer 156, the first metal fill layer 155 and the second metal fill layer 157 formed therein. The resulting via extends from a side of source/drain contact on one of the epitaxial source/drain regions 130. The resulting via extends along opposing sides of the epitaxial source/drain regions 130 on either side of the via to the semiconductor layer 103. The via extends through the ILD layer 125 and a portion of the dielectric layer 123 forming an isolation region. The filled-in gouged portion 142 results in a portion of the second metal fill layer 157 extending in the via toward the semiconductor layer 103 along upper parts of the opposing sides of the epitaxial source/drain regions 130 on either side of the via. The portion of the second fill layer extending in the via is bordered on two sides by the first metal fill layer 155 and on one side by the liner layer 156. In some areas of the contact trenches 140 and via opening 141, the first metal fill layer 155 is disposed between the second metal fill layer 157 and the liner layer 156. As can be seen in FIG. 10, the first metal fill layer 155 occupies a majority of the via.

Figure 11:
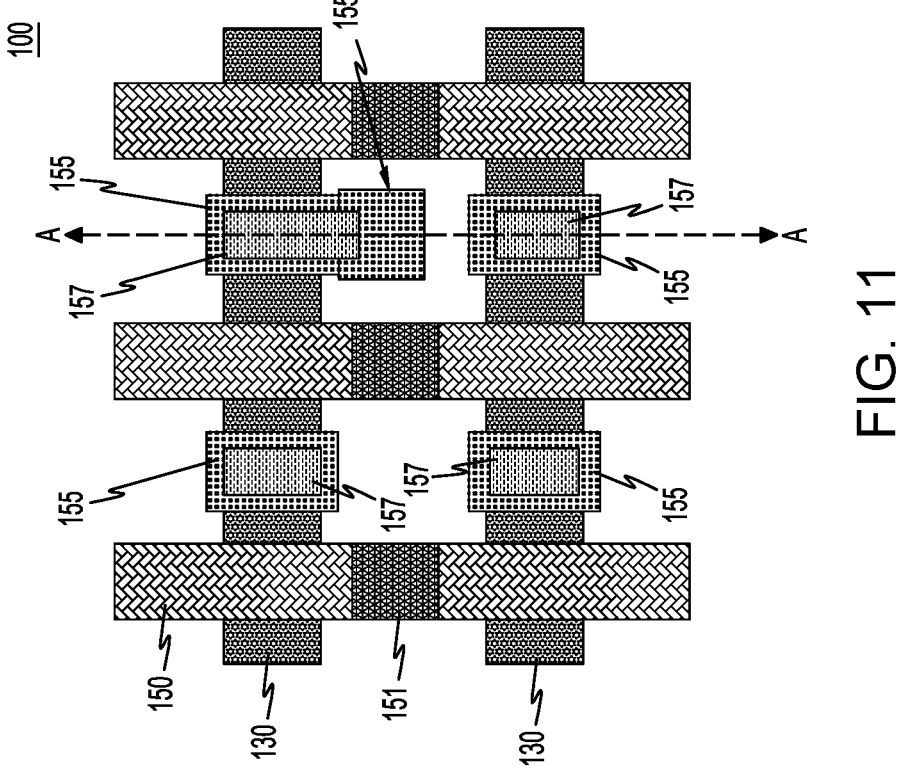
FIG. 11 is a schematic top view of a semiconductor structure including a portion of what is shown in FIG. 10, according to an embodiment of the invention.

FIG. 11 is a schematic top view of the semiconductor structure 100 including a portion of what is shown in FIG. 10. As can be understood, FIG. 10 includes the cross-section through line A-A of FIG. 11 with two filled-in contact trenches 140 on either side of the filled-in via opening 141. As noted herein, the contact trenches 140 and via opening 141 are filled in with the liner layer 156 and first and second metal fill layers 155 and 157. The liner layer 156 is not shown in FIG. 11. As can be seen in FIGS. 10 and 11, the via in via opening 141 is continuous with the contact formed in the contact trench 140 illustrated to the left of the via in FIG. 10, or above the via in FIG. 11. FIG. 11 illustrates a plurality of filled-in contact trenches 140 including first and second metal fill layers 155 and 157 formed therein. In addition, like FIG. 6, FIG. 11 illustrates transistor gate structures 150 and gate cut regions 151.

Figure 12:
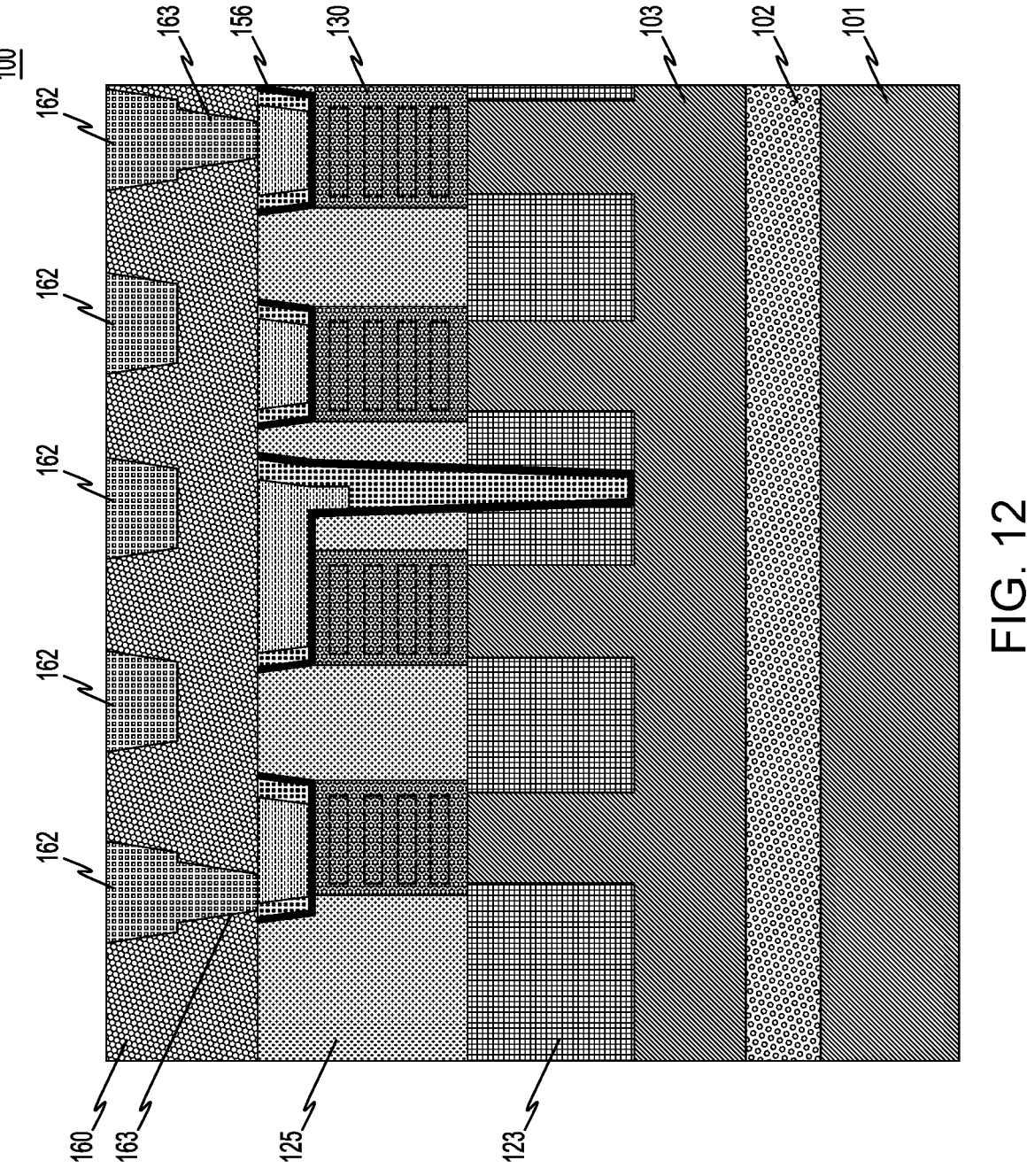
FIG. 12 is a schematic cross-sectional view illustrating metallization layer and via formation on the FIG. 10 structure, according to an embodiment of the invention.
Figure 13:
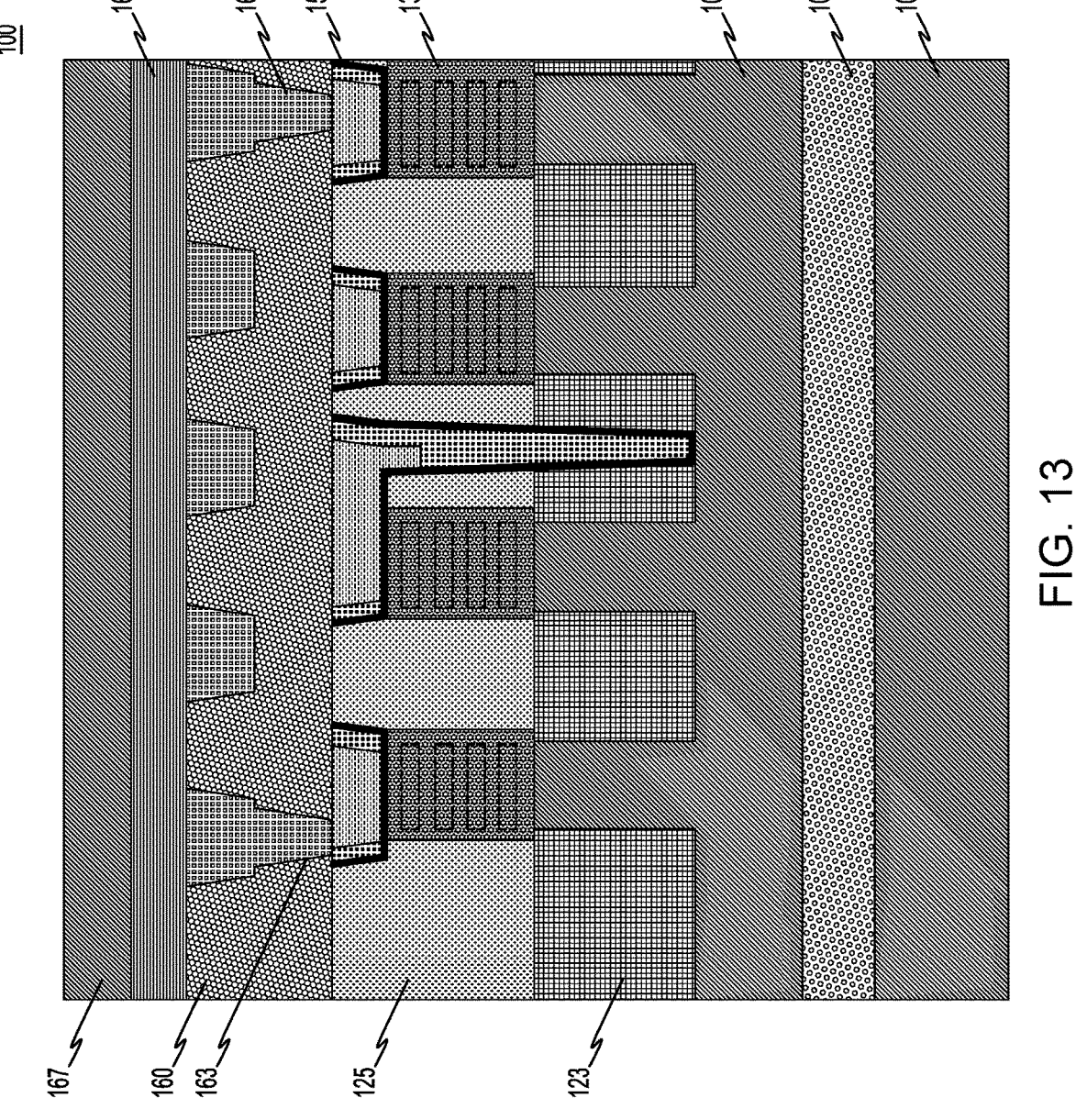
FIG. 13 is a schematic cross-sectional view illustrating back-end-of-line (BEOL) layer and carrier wafer formation on the FIG. 12 structure, according to an embodiment of the invention.

Referring to FIG. 12, middle-of-line (MOL) metallization layers 162 and vias 163 to source/drain contacts are formed in a dielectric layer 160. The dielectric layer 160 is formed on the ILD layer 125, and may be formed of any suitable isolating material, such as the same or similar material to that of the ILD layer 125 or some other dielectric. The MOL metallization layers 162 and vias 163 comprise a conductive metal such as, but not necessarily limited to, tungsten, cobalt and copper. Referring to FIG. 13, frontside BEOL interconnects 165 are formed on the dielectric layer 160 including the MOL metallization layers 162 and vias 163. A carrier wafer 167 is bonded to the frontside BEOL interconnects 165.

The frontside BEOL interconnects 165 include various BEOL interconnect structures. The carrier wafer 167 may be formed of materials similar to that of the semiconductor substrate 101 and may be formed over the frontside BEOL interconnects 165 using a wafer bonding process, such as dielectric-to-dielectric bonding.

Figure 14:
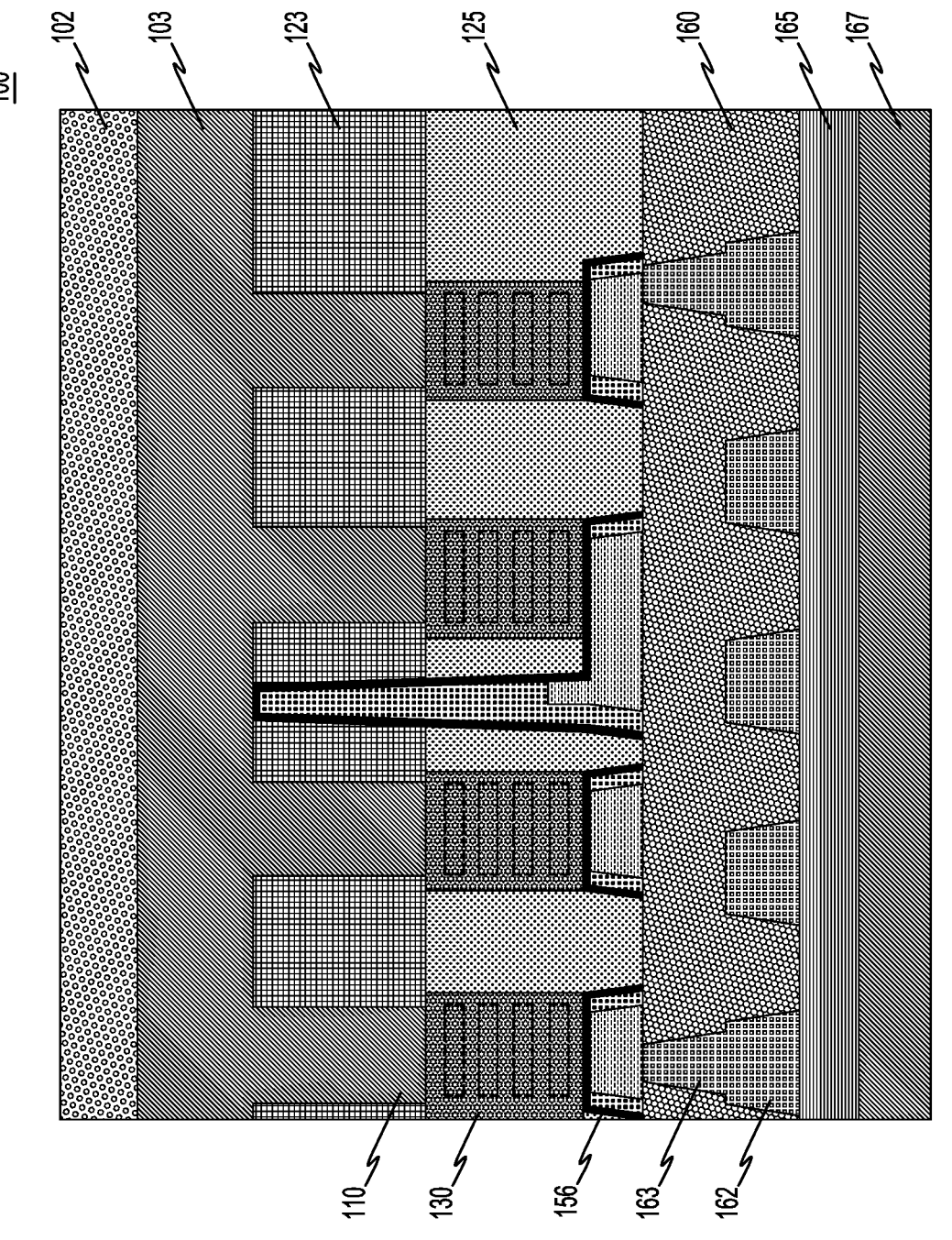
FIG. 14 is a schematic cross-sectional view illustrating rotation of and substrate removal from the FIG. 13 structure, according to an embodiment of the invention.

FIG. 14 is a schematic cross-sectional view illustrating rotation of and substrate removal from the FIG. 13 structure. Using the carrier wafer 167, the FIG. 13 structure may be "flipped" (e.g., rotated 180 degrees) so that the structure is inverted. In addition, the semiconductor substrate 101 is removed from the back side. The removal process, which comprises etching of the semiconductor substrate 101, stops at the etch stop layer 102 as illustrated in FIG. 14. For example, the semiconductor substrate 101 is selectively etched with an etchant that selectively etches silicon with respect to a material of the etch stop layer 102 (e.g., $SiO_2$ or SiGe). During the etching process, passive devices are protected by a mask (not shown).

Figure 15:
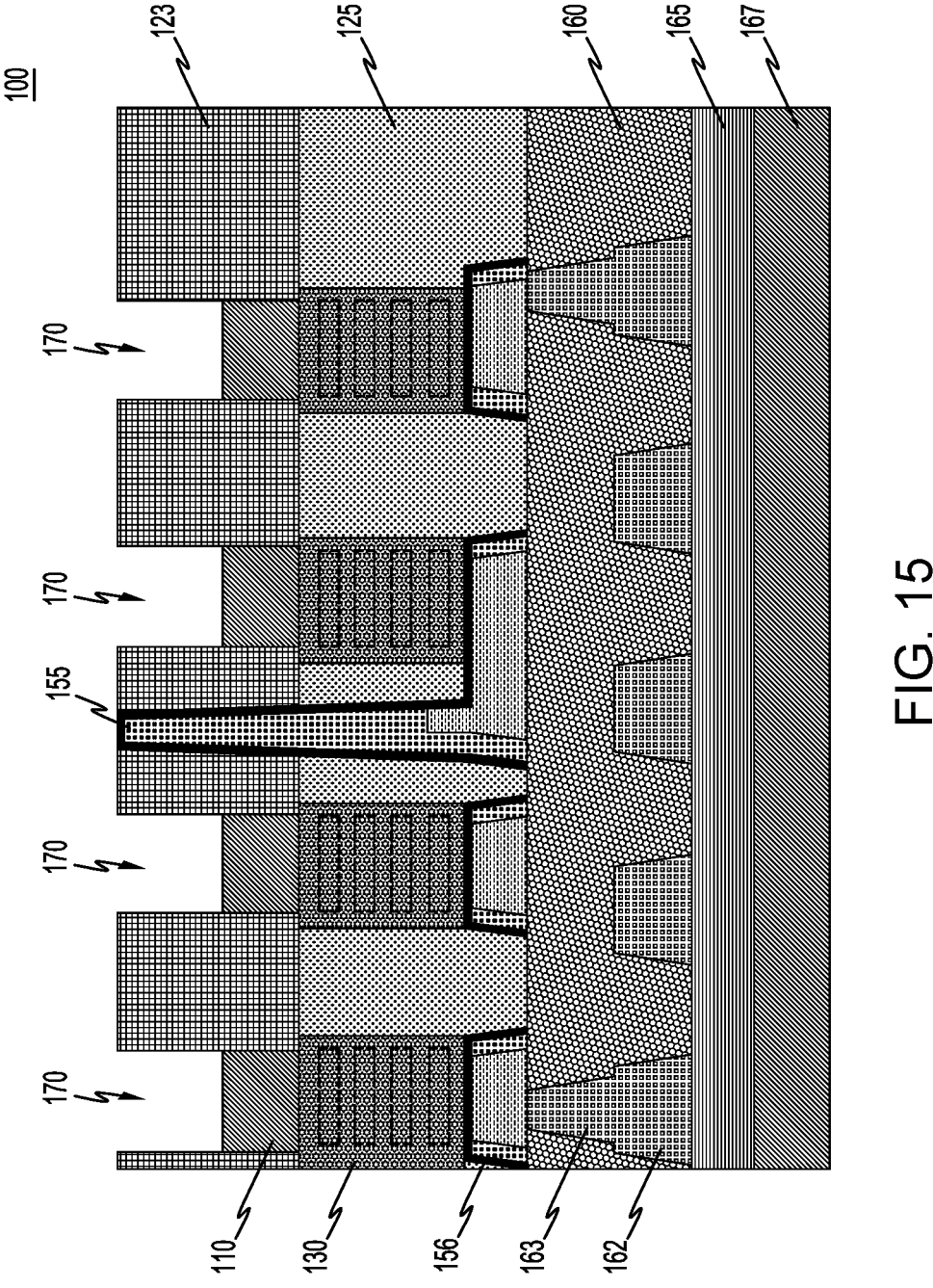
FIG. 15 is a schematic cross-sectional view illustrating etch stop layer removal and removal of portions of a semiconductor layer from the FIG. 14 structure, according to an embodiment of the invention.

FIG. 15 is a schematic cross-sectional view illustrating removal of the etch stop layer 102 and removal of portions of a semiconductor layer 103 including part of the pedestal portions 110 from the FIG. 14 structure. As shown in FIG. 15, the etch stop layer 102 is removed, followed by removal of the semiconductor layer 103 to expose portions of the dielectric layer 123 and a surface of the liner layer 156 of the via that was formed in the via opening 141 and extends from the source/drain contact formed in one of the contact trenches 140. As can be seen in FIG. 15, parts of the pedestal portions 110 are removed to create vacant areas 170 between the portions of the dielectric layer 123 forming the isolation regions. Etching processes for removal of the etch stop layer 102 include, for example, IBE by $Ar/CHF_3$ based chemistry, and etching processes for removal of the semiconductor layer 103 including the pedestal portions 110 comprise, for example, IBE by Ar with $SF_6$ or $Cl_2$.

Figure 16:
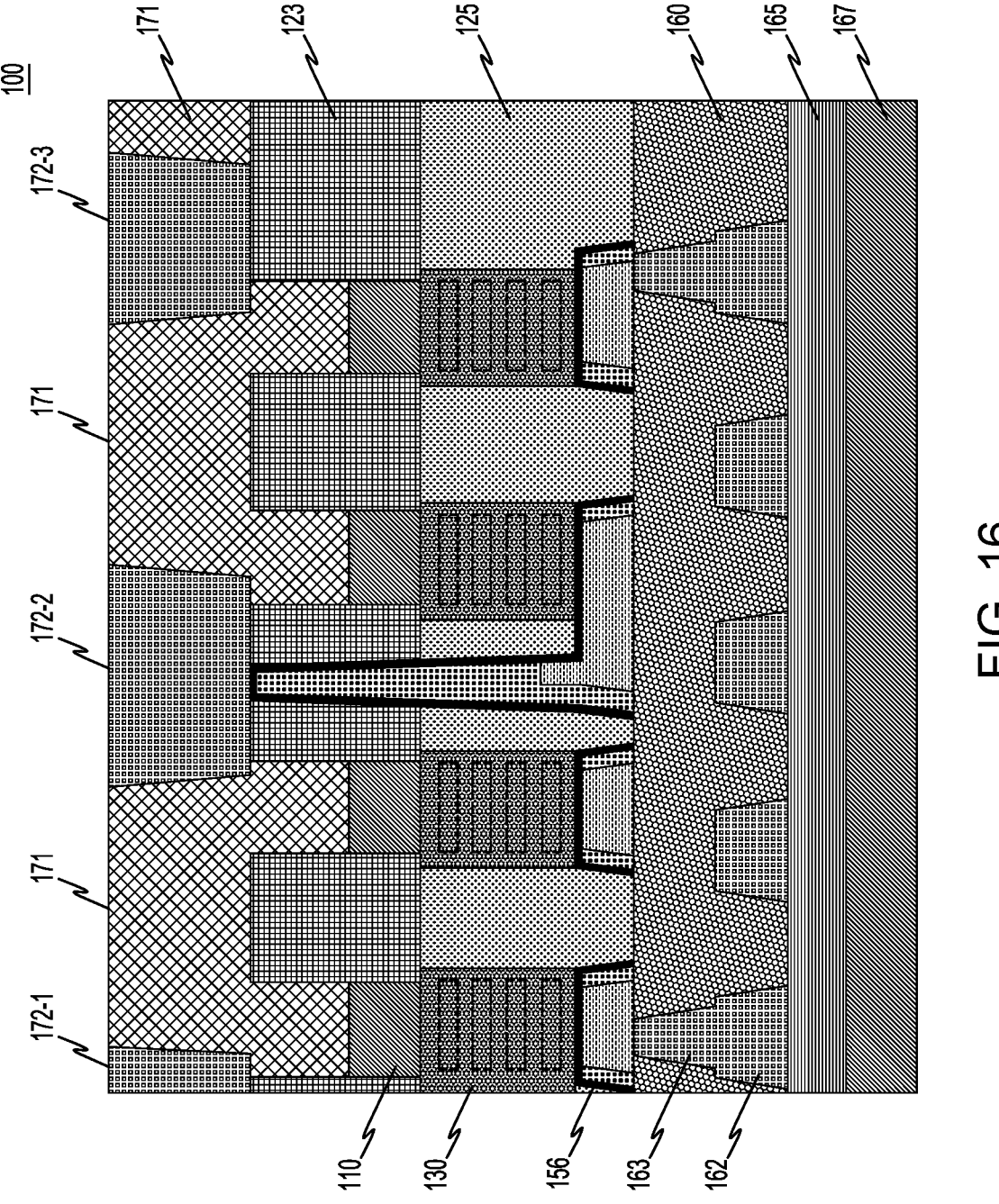
FIG. 16 is a schematic cross-sectional view illustrating backside ILD layer deposition and power element formation on the FIG. 15 structure, according to an embodiment of the invention.

Referring to FIG. 16, a backside ILD layer 171 is formed on the FIG. 15 structure. The backside ILD layer 171 fills in the vacant areas 170 between the portions of the dielectric layer 123 forming the isolation regions and is formed on top of the portions of the dielectric layer 123. The backside ILD layer 171 comprises the same or similar material to that of the ILD layer 125 and is deposited using one or more deposition techniques used for depositing the ILD layer 125. Backside power rails 172-1, 172-2 and 172-3 (collectively "backside power rails 172") (also referred to herein as "power elements") are formed in the backside ILD layer 171. The backside power rails 172-1, 172-2 and 172-3 are formed in the backside ILD layer 171 by forming trenches in the backside ILD layer 171 and filling the trenches with conductive material. Trenches are respectively opened in the backside ILD layer 171 using, for example, lithography followed by RIE. The backside power rails 172 are formed in the trenches by filling the trenches with conductive material, such as, for example, electrically conductive material including, but not necessarily limited to, tungsten, cobalt, zirconium, tantalum, titanium, aluminum, ruthenium, and/or copper. A liner layer (not shown) including, for example, titanium, titanium nitride and/or tantalum nitride, may be formed on side and bottom surfaces of the trenches before filling the trenches with the conductive material. Deposition of the conductive material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

As shown in FIG. 16, the backside power rail 172-2 is formed on and contacts the via that was formed in the via opening 141 and extends from the source/drain contact formed in one of the contact trenches 140. The backside power rail 172-2 delivers, for example, drain voltage (VDD) or source voltage (VSS) through the via and source/drain contact to the corresponding epitaxial source/drain region 130. The via, comprising the first and second metal fill layers 155 and 157, and the liner layer 156, contacts the backside power rail 172-2 and connects the epitaxial source/drain region 130 to the backside power rail 172-2 through the source/drain contact formed on the epitaxial source/drain region 130. The source/drain contact also comprises the first and second metal fill layers 155 and 157, and the liner layer 156. The via extends from the source/drain contact on a frontside through the ILD layer 125 and portion of the dielectric layer 123 to contact the backside power rail 172-2.

Figure 17:
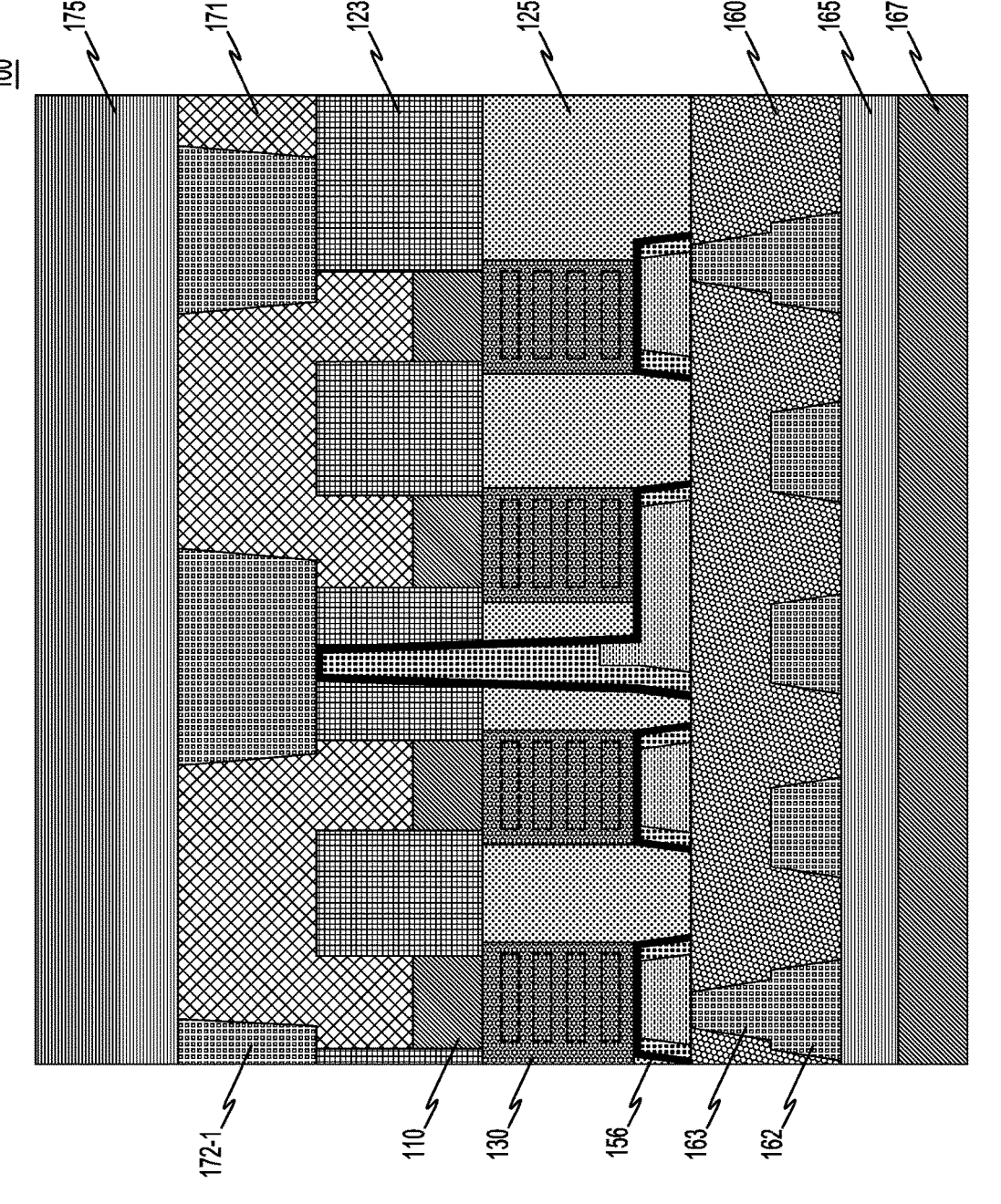
FIG. 17 is a schematic cross-sectional view taken illustrating power delivery network layer formation on the FIG. 16 structure, according to an embodiment of the invention.

Referring to FIG. 17, backside power delivery network (BSPDN) layers 175 are formed on the FIG. 16 structure. The backside power delivery network layers 175 include various BSPDN structures such as, but not necessarily limited to, interconnects in a power supply path from voltage regulator modules (VRMs) to circuits. The interconnects can comprise, for example, power and ground planes in circuit boards, cables, connectors and capacitors associated with a power supply. Backside power delivery prevents BEOL routing congestion, resulting in power performance benefits.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOS-FETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Figure 18:
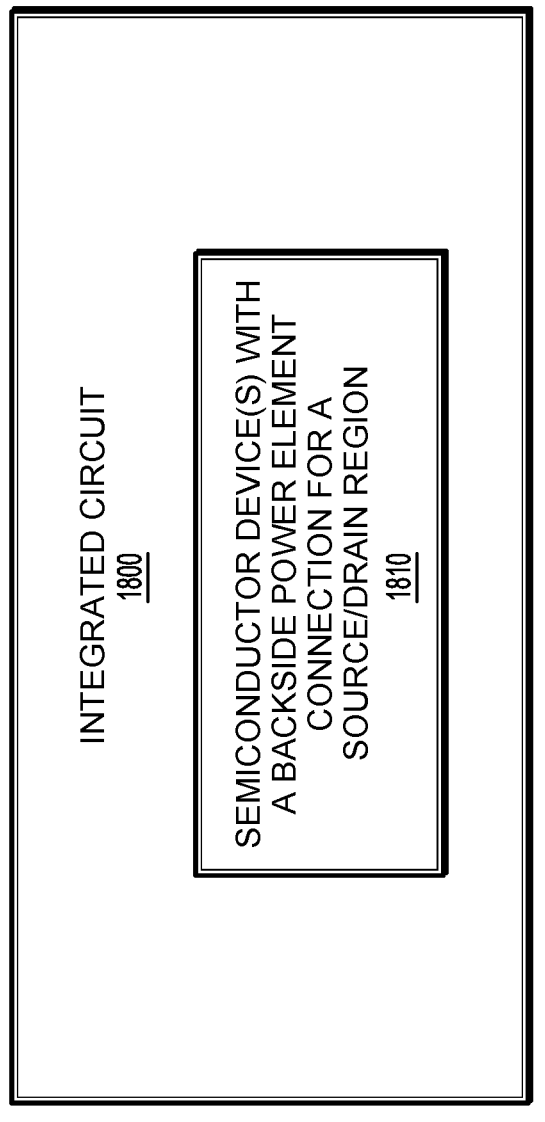
FIG. 18 depicts a block diagram of an integrated circuit comprising one or more semiconductor devices with a backside power element connection for a source/drain region, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections and buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 18 shows an example integrated circuit 1800 which includes one or more semiconductor devices 1810 with the above-described backside power element connection for a source/drain region (e.g., the via formed in the via opening 141 and extending from the source/drain contact formed in one of the contact trenches 140).

As noted above, illustrative embodiments correspond to methods for forming a backside power element connection to a source/drain region, where a source/drain contact and backside via between a source/drain region and a backside power element include composite contact materials, along with illustrative apparatus, systems and devices formed using such methods. The backside contact via passes through a frontside ILD layer and an isolation region to connect to a backside power rail, while using the same spacing or decreased spacing between transistors when compared with conventional structures. The composite structure of a liner layer and first and second metal fill layers comprising different materials extends scalability of a BSPDN due to improved metal fill (e.g., no voids) in the via. Additionally, the use of different first and second metal fill layers with different hardness (e.g., ruthenium and cobalt) avoids unwanted metal residue on an ILD layer and facilitates planarization after contact metal deposition. For example, prior to deposition and planarization of a second metal fill layer (which is easier to planarize than a first metal layer), the first metal fill layer is removed from upper surfaces of the ILD layer using a dry etch process.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a transistor comprising a source/drain region;
a contact disposed on the source/drain region; and
a via extending from the contact along a side of the source/drain region to a power element;
wherein the contact and the via each comprise a plurality of conductive materials; and
wherein the contact comprises:
a liner layer comprising a first conductive material;
a first fill layer on a first portion of the liner layer and comprising a second conductive material; and
a second fill layer on a second portion of the liner layer and comprising a third conductive material.

2. The semiconductor device of claim 1, wherein the power element comprises a power rail.

3. The semiconductor device of claim 1, further comprising an isolation region, wherein the power element is disposed on the isolation region and the via extends through the isolation region to contact the power element.

4. The semiconductor device of claim 1, wherein at least a portion of the first fill layer is disposed between the second fill layer and the liner layer.

5. The semiconductor device of claim 1, wherein the first conductive material comprises one of tantalum, tantalum nitride and titanium nitride, the second conductive material comprises a noble metal and the third conductive material comprises one of cobalt, copper and tungsten.

6. The semiconductor device of claim 1, wherein the via comprises:
a liner layer comprising a first conductive material;
a first fill layer on a first portion of the liner layer and comprising a second conductive material; and
a second fill layer on a second portion of the liner layer and comprising a third conductive material.

7. The semiconductor device of claim 6, wherein a portion of the second fill layer extends in the via along part of the side of the source/drain region.

8. The semiconductor device of claim 7, wherein the portion of the second fill layer is bordered on two sides by the first fill layer and on one side by the liner layer.

9. The semiconductor device of claim 6, wherein the first fill layer occupies a majority of the via.

10. The semiconductor device of claim 6, wherein the first conductive material comprises one of tantalum, tantalum nitride and titanium nitride, the second conductive material comprises a noble metal and the third conductive material comprises one of cobalt, copper and tungsten.

11. An integrated circuit comprising:
a transistor comprising a source/drain region;
a contact disposed on the source/drain region;
a power element;
an isolation region disposed on the power element; and
a via extending from the contact through the isolation region to the power element;
wherein the contact and the via each comprise a plurality of conductive materials; and
wherein the via comprises:
a liner layer comprising a first conductive material;
a first fill layer on a first portion of the liner layer and comprising a second conductive material; and
a second fill layer on a second portion of the liner layer and comprising a third conductive material.

12. The integrated circuit of claim 11, wherein the power element comprises a power rail.

13. The integrated circuit of claim 11, wherein at least a portion of the via is disposed along a side of the source/drain region.

14. The integrated circuit of claim 11, wherein a portion of the second fill layer extends in the via along part of a side of the source/drain region, and wherein the portion of the second fill layer is bordered on two sides by the first fill layer and on one side by the liner layer.

15. A semiconductor device, comprising:
a source/drain region disposed on a first side of a semiconductor layer;
a contact disposed on the source/drain region on the first side of the semiconductor layer;
a power element disposed on a second side of the semiconductor layer; and
a via extending from the contact along a side of the source/drain region to the power element;
wherein the contact and the via each comprise a plurality of conductive materials; and
wherein the via comprises:
a liner layer comprising a first conductive material;
a first fill layer on a first portion of the liner layer and comprising a second conductive material; and
a second fill layer on a second portion of the liner layer and comprising a third conductive material.

16. The semiconductor device of claim 15, wherein the power element comprises a power rail.

17. The semiconductor device of claim 15, further comprising an isolation region disposed on a side of the semiconductor layer, wherein the via extends through the isolation region to contact the power element.

* * * * *